US008106387B2

(12) United States Patent  
Wu et al.

(10) Patent No.: US 8,106,387 B2  
(45) Date of Patent: Jan. 31, 2012

(54) ORGANIC THIN FILM TRANSISTORS

(75) Inventors: Yiliang Wu, Mississauga (CA); Ping Liu, Mississauga (CA); Yuning Li, Singapore (CN); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 240 days.

(21) Appl. No.: 12/250,691

(22) Filed: Oct. 14, 2008

(65) Prior Publication Data

US 2010/0090200 A1   Apr. 15, 2010

(51) Int. Cl.  
*H01L 51/30* (2006.01)

(52) U.S. Cl. ............ 257/40; 257/E51.006; 257/E51.029

(58) Field of Classification Search ............ 257/40, 257/E51.001–E51.052; 438/99  
See application file for complete search history.

(56) References Cited

U.S. PATENT DOCUMENTS

| | | | |
|---|---|---|---|
| 6,433,359 B1 * | 8/2002 | Kelley et al. .................... 257/40 |
| 7,435,989 B2 * | 10/2008 | Nakayama et al. ............. 257/40 |
| 7,800,102 B2 * | 9/2010 | Park et al. ........................ 257/40 |
| 2003/0102472 A1 * | 6/2003 | Kelley et al. .................... 257/40 |
| 2004/0161873 A1 * | 8/2004 | Dimitrakopoulos et al. ... 438/99 |
| 2004/0214381 A1 * | 10/2004 | Ohta ............................. 438/197 |
| 2006/0086976 A1 * | 4/2006 | Mardilovich et al. ......... 257/347 |
| 2006/0113523 A1 * | 6/2006 | Kubota et al. .................. 257/40 |
| 2006/0160272 A1 * | 7/2006 | Effenberger et al. ......... 438/110 |
| 2006/0175603 A1 * | 8/2006 | Schmid et al. ................. 257/40 |

OTHER PUBLICATIONS

Pan, J., et al. "Low-Temperature, Solution-Processed, High-Mobility Polymer Semiconductors for Thin-Film Transistors." J. Am. Chem. Soc., vol. 129 (2007): pp. 4112-4113, Supporting Information.*  
Ong, B.S., et al. "High-Performance Semiconducting Polythiophenes for Organic Thin-Film Transistors." J. Am. Chem. Soc., vol. 126 (2004): pp. 3378-3379, Supporting Information.*  
Pan, H., et al. "Benzodithiophene Copolymer—A Low-Temperature, Solution-Processed High-Performance Semiconductor for Thin-Film Transistors." Adv. Funct. Mater., vol. 17 (2007): pp. 3574-3579.*  
U.S. Appl. No. 12/101,942, filed Apr. 11, 2008, entitled "Organic Thin Film Transistors".

* cited by examiner

*Primary Examiner* — Matthew W Such  
(74) *Attorney, Agent, or Firm* — Fay Sharpe LLP

(57) ABSTRACT

Organic thin film transistors with improved mobility are disclosed. The transistor contains two interfacial layers between the dielectric layer and the semiconducting layer. One interfacial layer is formed from a siloxane polymer or silsesquioxane polymer. The other interfacial layer is formed from an alkyl-containing silane of Formula (I):

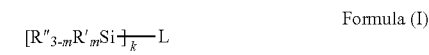

Formula (I)

where R' is alkyl having from about 1 to about 24 carbon atoms; R" is alkyl having from about 1 to about 24 carbon atoms, halogen, alkoxy, hydroxyl, or amino; L is halogen, oxygen, alkoxy, hydroxyl, or amino; k is 1 or 2; and m is 1 or 2.

18 Claims, 2 Drawing Sheets

ORGANIC THIN FILM TRANSISTORS

CROSS-REFERENCE TO RELATED APPLICATIONS

The present disclosure is related to U.S. patent application Ser. No. 12/101,942, filed Apr. 11, 2008. That application is hereby fully incorporated by reference herein.

BACKGROUND

The present disclosure relates, in various embodiments, to compositions and processes suitable for use in electronic devices, such as thin film transistors ("TFT"s). The present disclosure also relates to components or layers produced using such compositions and processes, as well as electronic devices containing such materials.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of a supporting substrate, three electrically conductive electrodes (gate, source and drain electrodes), a channel semiconducting layer, and an electrically insulating gate dielectric layer separating the gate electrode from the semiconducting layer.

It is desirable to improve the performance of known TFTs. Performance can be measured by at least two properties: the mobility and the on/off ratio. The mobility is measured in units of cm$^2$/V·sec; higher mobility is desired. The on/off ratio is the ratio between the current that runs through the TFT in the on state and the amount of current that leaks through the TFT in the off state. Typically, a higher on/off ratio is more desirable.

BRIEF DESCRIPTION

The present disclosure is directed, in various embodiments, to a thin film transistor having two interfacial layers of given structure between the dielectric layer and the semiconducting layer that provides improved performance.

In embodiments, a thin film transistor comprises a dielectric layer, a first interfacial layer, a second interfacial layer, and a semiconducting layer;
  wherein the first and second interfacial layers are between the dielectric layer and the semiconducting layer;
  wherein the first interfacial layer is formed from a siloxane polymer or silsesquioxane polymer; and
  wherein the second interfacial layer is formed from a silane of Formula (I):

Formula (I)

where R' is alkyl having from about 1 to about 24 carbon atoms; R" is alkyl having from about 1 to about 24 carbon atoms, halogen, alkoxy, hydroxyl, or amino; L is halogen, oxygen, alkoxy, hydroxyl, or amino; k is 1 or 2; and m is 1, 2, or 3.

R' may be alkyl having from about 8 to about 18 carbon atoms.

The silane of Formula (I) may be a silane of the formula R'SiX$_3$, wherein R' is alkyl having from about 1 to about 24 carbon atoms, and X is halogen. In particular embodiments, R' is C$_{12}$H$_{25}$ and X is chlorine.

The first interfacial layer may be formed from poly(methyl silsesquioxane). The first interfacial layer may also be from about 1 nanometer to about 100 nanometers in thickness.

The transistor has an increased mobility of at least 50% or at least 100% compared to a transistor with only a single interfacial layer.

The semiconducting layer may be formed from a polymer that comprises a moiety of Formula (II):

Formula (II)

wherein R$_1$ is alkyl.

The R' of the silane of Formula (I) and the R$_1$ of the moiety of Formula (II) may be identical and are straight chain alkyl having from about 8 to about 18 carbon atoms.

The semiconducting layer may comprise a semiconductor of Formula (III):

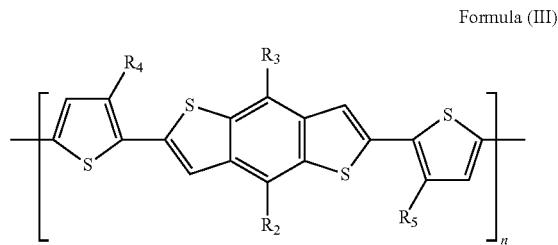

Formula (III)

wherein R$_2$ and R$_3$ are independently selected from alkyl, substituted alkyl, aryl, and substituted aryl; R$_4$ and R$_5$ are independently selected from hydrogen, alkyl, substituted alkyl, aryl, and substituted aryl; and n is from 2 to 10,000.

In some embodiments, R$_2$, R$_3$, R$_4$, and R$_5$ may be identical to each other and are straight chain alkyl having from about 8 to about 18 carbon atoms.

In other embodiments, the R' of the silane of Formula (I) and R$_2$, R$_3$, R$_4$, and R$_5$ may be identical. R$_2$, R$_3$, R$_4$, and R$_5$ may specifically be C$_{12}$H$_{25}$.

The first interfacial layer contacts the dielectric layer and the second interfacial layer contacts the semiconducting layer in some embodiments.

In other embodiments, a thin-film transistor comprises:
  a gate electrode, a source electrode, a drain electrode, a dielectric layer, a first interfacial layer, a second interfacial layer, and a semiconducting layer;
  wherein the dielectric layer is located between the gate electrode and the semiconducting layer;
  wherein the first and second interfacial layers are between the dielectric layer and the semiconducting layer;
  wherein the first interfacial layer is formed from poly(methyl silsesquioxane); and wherein the second interfacial layer is formed from a silane of the formula $C_{12}H_{25}SiX_3$, where X is selected from Cl, $OCH_3$, and mixtures thereof.

Also included in further embodiments are the interfacial layers and/or thin film transistors produced by this process.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
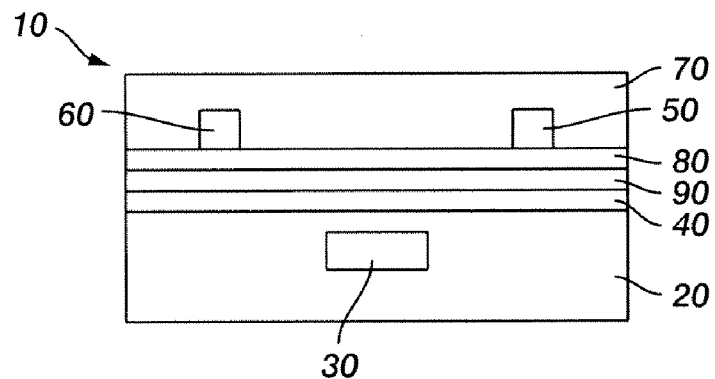
FIG. 1 is a first exemplary embodiment of an OTFT of the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first OTFT embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60. Interfacial layers 80 and 90 are located between dielectric layer 40 and semiconducting layer 70.

Figure 2:
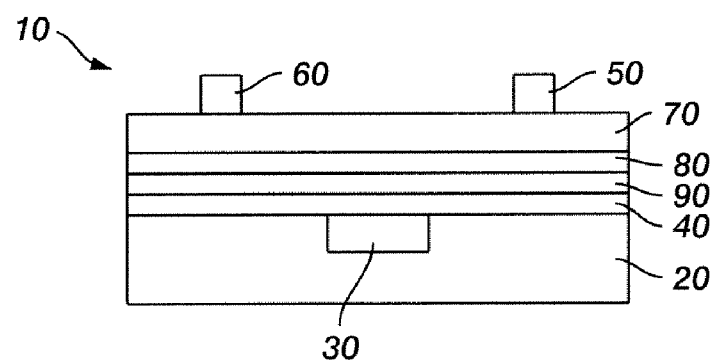
FIG. 2 is a second exemplary embodiment of an OTFT of the present disclosure.

FIG. 2 illustrates a second OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60. Interfacial layers 80 and 90 are located between dielectric layer 40 and semiconducting layer 70.

Figure 3:
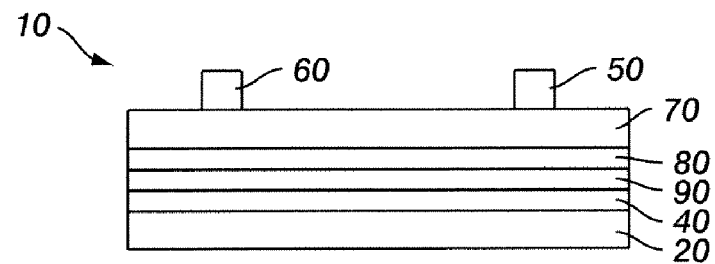
FIG. 3 is a third exemplary embodiment of an OTFT of the present disclosure.

FIG. 3 illustrates a third OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60. Interfacial layers 80 and 90 are located between dielectric layer 40 and semiconducting layer 70.

Figure 4:
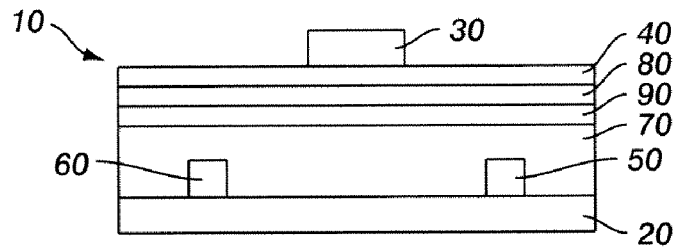
FIG. 4 is a fourth exemplary embodiment of an OTFT of the present disclosure.

FIG. 4 illustrates a fourth OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70. Interfacial layers 80 and 90 are located between dielectric layer 40 and semiconducting layer 70.

As charge transport in an organic thin film transistor occurs at the interface between the semiconducting layer and the dielectric layer, this interface is a critical part of determining the TFT's properties. In the devices of the present disclosure, two interfacial layers are located between the dielectric layer and the semiconducting layer to modify this interface. One interfacial layer is formed from a siloxane polymer or a silsesquioxane polymer. The other interfacial layer is formed from a silane of Formula (I), as described further herein.

The siloxane polymer or silsesquioxane polymer of the first interfacial layer are generally of Formulas (A) or (B) respectively, as shown here:

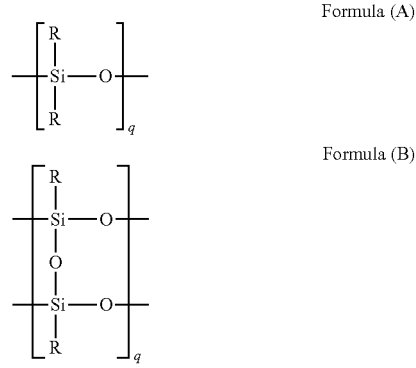

Formula (A)

Formula (B)

wherein R is selected from hydrogen, alkyl, and aryl; and q is the degree of polymerization and can be from 2 to 10,000. In particular embodiments, the first interfacial layer is made from poly(methyl silsesquioxane).

The first interfacial layer may be applied via typical deposition processes, such as liquid processes like spin coating, dip coating, blade coating, printing such as inkjet printing, etc. Typical thicknesses of the first interfacial layer may be from about 1 nanometer to about 100 nanometers, including from about 1 nanometer to about 50 nanometers, or from about 1 nanometer to about 20 nanometers. In embodiments, the first interfacial layer is crosslinked, showing high resistance to most organic solvent such as alcohol, hydrocarbon including hexane, cyclohexane, and heptane, aromatic hydrocarbon such as toluene and xylene, ether, ester, chlorinated solvent such as chlorobenzene, dichlorobenzene, and dichloromethane. The first interfacial layer is thermally crosslinked for example at a temperature from about 80 to about 180 degree C. for from about 5 min to about 1 hour.

The second interfacial layer is formed from a silane of Formula (I):

Formula (I)

where R' is alkyl having from about 1 to about 24 carbon atoms; R" is alkyl having from about 1 to about 24 carbon atoms, halogen, alkoxy, hydroxyl, or amino; L is halogen, oxygen, alkoxy, hydroxyl, or amino; k is 1 or 2; and m is 1, 2, or 3. Generally, R" and L are leaving groups which allow the interfacial layer to form from the silane.

An exemplary example of a silane of Formula (I) is hexamethyldisilazane (HMDS), where R'=CH$_3$, R"=CH$_3$, m=1, k=2, and L=NH. In some embodiments of Formula (I), R' is alkyl having from about 8 to about 18 carbon atoms, particularly about 12 carbon atoms. In more specific embodiments, the silane of Formula (I) is a silane of the formula R'SiX$_3$, wherein R' is alkyl having from about 1 to about 24 carbon atoms, and X is halogen, alkoxy such as OCH$_3$, and mixtures thereof (where m=1, k=1, and L=R"=X). Usually, X is chlorine. In one specific embodiment, R' is C$_{12}$H$_{25}$ and X is chlorine. This particular silane is dodecyltrichlorosilane. Other exemplary silanes of the formula R'SiX$_3$ include octyltrichlorosilane and octadecyltrichlorosilane.

Figure 5A:
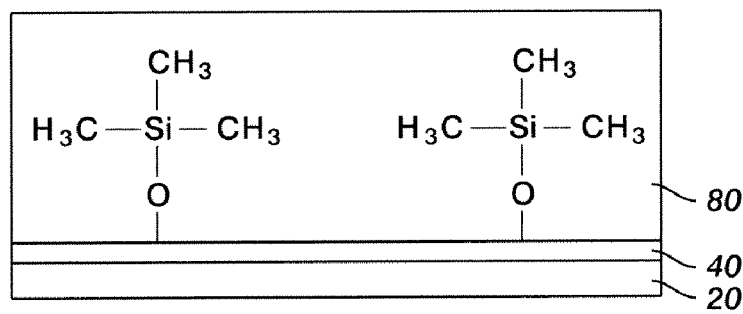
FIG. 5A is a first depiction of an interfacial layer used in the present disclosure.
Figure 5B:
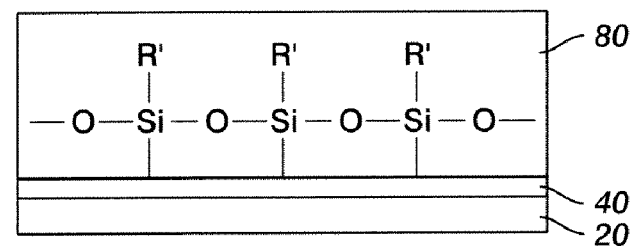
FIG. 5B is a second depiction of an interfacial layer used in the present disclosure.

The silane of Formula (I) will interact with a substrate to form a silanized interfacial layer having alkyl sidechains extending from the surface of the interfacial layer. Though not bound by this theory, the resulting interfacial layer is believed to take the form of individual or interconnected silicon atoms having an R' sidechain extending from the surface. Exemplary depictions of the interfacial layer are shown in FIGS. 5A and 5B. In FIG. 5A, the interfacial layer is formed from HMDS and is believed to take the form of individual silicon atoms covalently bonded to the substrate. Here, the sidechain is methyl. In FIG. 5B, the interfacial layer is formed from interconnected silicon atoms. Here, the interconnection results from oxygen atoms, which form a "siloxanized" interfacial layer. The interfacial layer formed may be either a monolayer or a multilayer, as the sidechains may interact with each other as well. In embodiments, the interfacial layer formed from the silane of Formula (I) is a monolayer having a thickness from about 2 to about 30 angstroms. In other embodiments, the interfacial layer formed from the silane of Formula (I) is a multilayer which has a total thickness of from at least 10 angstroms to about 100 angstroms, or from at least 20 angstroms to about 100 angstroms.

The interfacial layer formed from the silane of Formula (I) can be formed from a silane solution comprising the silane and a solvent selected from the group consisting of aromatic hydrocarbons and aliphatic hydrocarbons. Exemplary hydrocarbons include, toluene, xylene, heptanes, octane, decane, dodecane, ISOPAR G (available from ExxonMobil), and the like. The silane solution can be optionally aged at a relative humidity of from about 30% to 80%, especially from about 35% to 60%, at a temperature of from about 20° C. to about 80° C., especially from about 25 to about 60° C., for from about 10 minutes to about 60 minutes, especially from about 20 minutes to about 30 minutes. In embodiments, the silane solution is aged. The concentration of the silane is from about 0.001 M to about 0.5M, or from about 0.01 to 0.1M. In embodiments, the solvent is toluene and the concentration is 0.1M. A hydrophilic surface can then be coated with the silane solution to form the second interfacial layer. The coating may be performed by spin coating, dip coating, bar coating, and the like. In particular, the aging step lowers the surface energy of the resulting second interfacial layer. This can be seen in a higher advancing water contact angle. For example, using octyltrichlorosilane, the advancing water contact angle was increased from 90° without the aging step to 100° with the aging step. Though not bound by this theory, it is believed that the silane molecules react with each other during the aging step to form a silane network through hydrogen bonding. The hydrogen bonded network will react with hydroxyl groups on the hydrophilic surface to form the interfacial layer. Thus, a uniform interfacial layer can be achieved with no or little dependence on the properties of the hydrophilic surface.

The two interfacial layers may be in either order with respect to the dielectric layer and the semiconducting layer. However, in particular embodiments, the polysiloxane/polysilsesquioxane interfacial layer is closer to the dielectric layer than the interfacial layer formed from the silane of Formula (I). In other embodiments, the interfacial layer formed from the silane of Formula (I) contacts the semiconducting layer. The combination of the two interfacial layers improves performance of the thin film transistor synergistically over what would be expected by the performance of the individual interfacial layers themselves.

Process to form the interfacial layers may include: 1) deposit the first interfacial layer, 2) crosslinking the first interfacial layer, 3) surface treatment of the first interfacial layer to create hydroxyl groups on the surface, 4) form the second interfacial layer on top of the first interfacial layer, where the second interfacial layer is chemically bonded to the first interfacial layer. In embodiment, the surface treatment of the first interfacial layer prior to formation of second interfacial layer is plasma treatment. For example the surface of the first interfacial layer is exposed to air or oxygen plasma for from about 2 seconds to about 2 min.

The semiconducting layer comprises a semiconducting material. Exemplary semiconductor materials include, but are not limited to, acenes and polyacenes like anthracene, tetracene, pentacene, and their substituted derivatives; perylenes; fullerenes; semiconducting polymers such as triarylamine polymers, polyindolocarbazole, polycarbazole, and polyfluorene; polythiophenes and their substituted derivatives; and phthalocyanines such as copper phthalocyanines or zinc phthalocyanines and their substituted derivatives.

The semiconducting layer is from about 5 nm to about 1000 nm thick, especially from about 10 nm to about 100 nm thick. The semiconducting layer can be formed by any suitable method. However, the semiconducting layer is generally formed from a liquid composition, such as a dispersion or solution, and then deposited onto the substrate of the transistor. Exemplary deposition methods include liquid deposition such as spin coating, dip coating, blade coating, rod coating, screen printing, stamping, ink jet printing, and the like, and other conventional processes known in the art.

In some embodiments, the semiconducting layer comprises a polymer that includes a moiety of Formula (II):

Formula (II)

wherein R$_1$ is alkyl.

In other embodiments, the semiconducting layer comprises a semiconducting material of Formula (III):

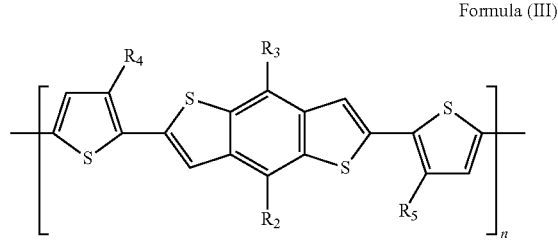

Formula (III)

wherein R$_2$ and R$_3$ are independently selected from alkyl, substituted alkyl, aryl, and substituted aryl; R$_4$ and R$_5$ are independently selected from hydrogen, alkyl, substituted alkyl, aryl, and substituted aryl; and n is from 2 to 10,000, preferably from 2 to about 100. In particular embodiments, $R_2$, $R_3$, $R_4$, and $R_5$ are identical to each other and are straight chain alkyl having from about 8 to about 18 carbon atoms. In more particular embodiments, $R_2$, $R_3$, $R_4$, and $R_5$ are $C_{12}H_{25}$.

Without being bound by theory, it is believed that the alkyl sidechains in the interfacial layer, combined with the alkyl sidechains of the semiconducting material of Formula (III), result in the formation of lamellar sheets, which is beneficial to charge transport (and the consequent charge carrier mobility). As a result, it is generally desirable for the alkyl sidechains in the interfacial layer and the semiconducting material to be of the same length. Thus, in some embodiments, the R' of the silane of Formula (I) and the $R_1$ of the monomer of Formula (II) are identical and are straight chain alkyl having from about 8 to about 18 carbon atoms. In others, the R' of the silane of Formula (I) and $R_2$, $R_3$, $R_4$, and $R_5$ of the material of Formula (III) are identical.

In one specific example, $R_1$, $R_2$, $R_3$, and $R_4$ are each $C_{12}H_{25}$. This particular semiconductor is known as PBTBT-12, and has the formula:

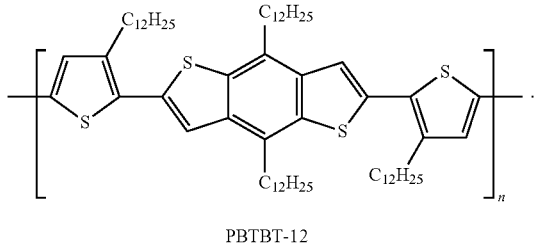

PBTBT-12

PBTBT-12 can be prepared as disclosed in U.S. patent application Ser. No. 11/586,449, filed on Oct. 25, 2006. That application is hereby fully incorporated by reference herein.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. A particularly desirable dielectric layer consists of silicon oxide. The dielectric layer may have a conductivity that is, for example, less than about $10^{-12}$ Siemens per centimeter (S/cm). The dielectric layer is formed using conventional processes known in the art, including those processes described in forming the gate electrode.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The semiconducting polymer formed by the methods of the present disclosure may be deposited onto any appropriate component of an organic thin-film transistor to form a semiconducting layer of that transistor.

The resulting transistor may have, in embodiments, a mobility of about 0.01 $cm^2/V \cdot sec$ or greater. The transistor of the present disclosure, having the two interfacial layers, may have an improved mobility of at least 50% compared to a transistor having only a single interfacial layer. In some embodiments, the improvement in mobility is at least 100%.

The following examples illustrate an OTFT made according to the methods of the present disclosure. The examples are merely illustrative and are not intended to limit the present disclosure with regard to the materials, conditions, or process parameters set forth therein. All parts are percentages by weight unless otherwise indicated.

EXAMPLES

Example 1

An n-doped silicon wafer was used as the substrate to fabricate OTFT devices, wherein the n-doped silicon functioned as the gate electrode. The silicon wafer had a 100-nm thick layer of silicon oxide, which functioned as the dielectric layer.

The wafer surface was plasma-cleaned. A first interfacial layer of poly(methyl silsesquioxane) (PMSSQ) was applied by spin-coating a dilute solution of PMSSQ in methyl isobutyl ketone (MIBK) at 1000 rpm for 60 seconds, followed by drying at 80° C. and thermal crosslinking at 160° C. for 30 minutes to form a layer about 90 nm thick.

The PMSSQ-modified wafer was again plasma-cleaned. The PMSSQ-modified wafer was then immersed in a 0.1 M solution of dodecyltrichlorosilane (DTS) in heptane at room temperature for 20 minutes to form a second interfacial layer. After being washed with toluene and isopropanol, the PMSSQ and DTS modified wafer was air-dried.

A solution of 1 wt % PBTBT-12 in dichlorobenzene was filtered through a 1.0 μm syringe filter. The warm solution was then spin-coated at 1000 rpm for 90 seconds on top of the second interfacial layer to form a semiconducting layer. After drying off the solvent, gold source/drain electrodes were evaporated through a shadow mask on top of the semiconducting layer to complete the OTFT devices. The total capacitance of the modified wafer was 15 nF/cm².

Comparative Examples 1 and 2

Comparative Example 1 was manufactured similarly to Example 1, but with only the PMSSQ interfacial layer applied.

Comparative Example 2 was manufactured similarly to Example 1, but with only the DTS interfacial layer applied.

RESULTS

The devices were characterized with a Keithley 4200-SCS instrument at ambient conditions in the dark. Table 1 shows the composition of the various tested devices and the mobility and on/off ratio data for those devices.

TABLE 1

| Example | Dielectric Layer | Interfacial Layer | Mobility (cm²/V · sec) | On/Off Ratio |
|---|---|---|---|---|
| Example 1 | SiO₂ | PMSSQ/DTS | 0.57 | 10⁶–10⁷ |
| Comparative 1 | SiO₂ | PMSSQ | 0.03 | 10⁵ |
| Comparative 2 | SiO₂ | DTS | 0.17 | 10⁶ |

Example 1 had the best mobility and on/off ratio. The mobility in particular was unexpected; it was 19 times better than Comparative Example 1 and more than 3 times better than Comparative Example 2.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin film transistor comprising a dielectric layer, a first interfacial layer, a second interfacial layer, and a semiconducting layer;
   wherein the first and second interfacial layers are between the dielectric layer and the semiconducting layer, wherein the first interfacial layer contacts the dielectric layer and the second interfacial layer, and wherein the second interfacial layer contacts the first interfacial layer and the semiconducting layer;
   wherein the first interfacial layer is formed from a siloxane polymer or silsesquioxane polymer; and
   wherein the second interfacial layer is formed from a silane of Formula (I):

where R' is alkyl having from about 1 to about 24 carbon atoms; R" is alkyl having from about 1 to about 24 carbon atoms, halogen, alkoxy, hydroxyl, or amino; L is halogen, oxygen, alkoxy, hydroxyl, or amino; k is 1 or 2; and m is 1, 2, or 3.

2. The transistor of claim 1, wherein R' is alkyl having from about 8 to about 18 carbon atoms.

3. The transistor of claim 1, wherein the silane of Formula (I) is a silane of the formula R'SiX₃, wherein R' is alkyl having from about 1 to about 24 carbon atoms, and X is halogen.

4. The transistor of claim 3, wherein R' is $C_{12}H_{25}$ and X is chlorine.

5. The transistor of claim 1, wherein the first interfacial layer is formed from poly(methyl silsesquioxane).

6. The transistor of claim 1, wherein the first interfacial layer is from about 1 nanometer to about 100 nanometers in thickness.

7. The transistor of claim 1, wherein the semiconducting layer is formed from a polymer that comprises a moiety of Formula (II):

wherein $R_1$ is alkyl.

8. The transistor of claim 7, wherein the R' of the silane of Formula (I) and the $R_1$ of the moiety of Formula (II) are identical and are straight chain alkyl having from about 8 to about 18 carbon atoms.

9. The transistor of claim 1, wherein the semiconducting layer comprises a semiconductor of Formula (III):

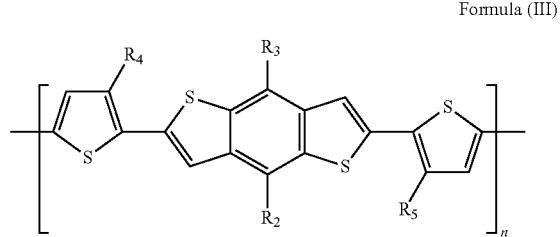

wherein $R_2$ and $R_3$ are independently selected from alkyl, substituted alkyl, aryl, and substituted aryl; $R_4$ and $R_5$ are independently selected from hydrogen, alkyl, substituted alkyl, aryl, and substituted aryl; and n is from 2 to 10,000.

10. The transistor of claim 9, wherein $R_2$, $R_3$, $R_4$, and $R_5$ are identical to each other and are straight chain alkyl having from about 8 to about 18 carbon atoms.

11. The transistor of claim 10, wherein the R' of the silane of Formula (I) and $R_2$, $R_3$, $R_4$, and $R_5$ are identical.

12. The transistor of claim 9, wherein $R_2$, $R_3$, $R_4$, and $R_5$ are $C_{12}H_{25}$.

13. A thin-film transistor, comprising:
   a gate electrode, a source electrode, a drain electrode, a dielectric layer, a first interfacial layer, a second interfacial layer, and a semiconducting layer;
   wherein the dielectric layer is located between the gate electrode and the semiconducting layer;

wherein the first and second interfacial layers are between the dielectric layer and the semiconducting layer, and the first interfacial layer contacts the second interfacial layer;

wherein the first interfacial layer is formed from poly(methyl silsesquioxane); and wherein the second interfacial layer is formed from a silane of the formula $C_{12}H_{25}SiX_3$, where X is selected from Cl, $OCH_3$, and mixtures thereof.

14. The transistor of claim 13, wherein the semiconducting layer is formed from a polymer that comprises a moiety of Formula (II):

Formula (II)

wherein $R_1$ is $C_{12}H_{25}$.

15. The transistor of claim 13, wherein the semiconducting layer comprises a semiconductor of Formula (III):

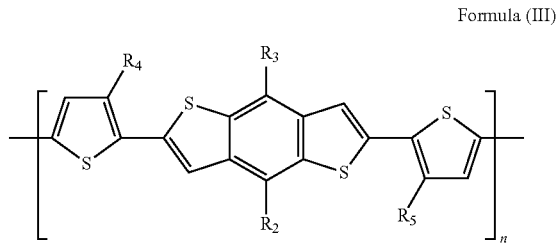

Formula (III)

wherein $R_2$ and $R_3$ are independently selected from alkyl, substituted alkyl, aryl, and substituted aryl; $R_4$ and $R_5$ are independently selected from hydrogen, alkyl, substituted alkyl, aryl, and substituted aryl; and n is from 1 to 10,000.

16. The transistor of claim 15, wherein $R_2$, $R_3$, $R_4$, and $R_5$ are $C_{12}H_{25}$.

17. The transistor of claim 13, wherein the first interfacial layer is positioned closer to the dielectric layer than the second interfacial layer.

18. A thin-film transistor, comprising:
a gate electrode, a source electrode, a drain electrode, a dielectric layer, a first interfacial layer, a second interfacial layer, and a semiconducting layer;
wherein the dielectric layer is located between the gate electrode and the semiconducting layer;
wherein the first interfacial layer is formed from poly(methyl silsesquioxane), a bottom surface of the first interfacial layer contacts the dielectric layer, a top surface of the first interfacial layer contacts a bottom surface of the second interfacial layer, and the top surface of the first interfacial layer does not contact the semiconducting layer;
wherein the second interfacial layer is formed from a silane of the formula $C_{12}H_{25}SiX_3$, where X is selected from Cl, $OCH_3$, and mixtures thereof, and a top surface of the second interfacial layer contacts the semiconducting layer; and
the first interfacial layer and the second interfacial layer separate the dielectric layer from the semiconducting layer.

* * * * *